United States Patent
Simonis et al.

(10) Patent No.: US 11,835,589 B2
(45) Date of Patent: Dec. 5, 2023

(54) METHOD AND APPARATUS FOR MACHINE-INDIVIDUAL IMPROVEMENT OF THE LIFETIME OF A BATTERY IN A BATTERY-OPERATED MACHINE

(71) Applicant: Robert Bosch GmbH, Stuttgart (DE)

(72) Inventors: Christian Simonis, Leonberg (DE); Christoph Woll, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 18 days.

(21) Appl. No.: 17/487,848

(22) Filed: Sep. 28, 2021

(65) Prior Publication Data
US 2022/0099752 A1     Mar. 31, 2022

(30) Foreign Application Priority Data
Sep. 29, 2020 (DE) .................... 10 2020 212 278.4

(51) Int. Cl.
    *G01R 31/392*     (2019.01)
    *G01R 31/396*     (2019.01)
    (Continued)

(52) U.S. Cl.
CPC ......... *G01R 31/392* (2019.01); *G01R 31/367* (2019.01); *G01R 31/396* (2019.01); *G06N 20/00* (2019.01); *G06N 3/047* (2023.01)

(58) Field of Classification Search
CPC .. G01R 31/392; G01R 31/367; G01R 31/396; G01R 31/3648; G01R 31/007; G06N 20/00; G06N 3/0472; Y04S 30/12; B60L 2250/16; B60L 2250/18; B60L 53/62; B60L 53/68; B60L 2260/50; B60L 58/16; Y02T 90/16; Y02T 90/12; Y02T 90/167; Y02T 10/70; Y02T 10/7072
See application file for complete search history.

(56) References Cited

U.S. PATENT DOCUMENTS

2014/0129163 A1 *   5/2014   Betzner ............... H01M 10/486
                                                                   702/63
2016/0209473 A1 *   7/2016   You ....................... G01R 31/367
(Continued)

FOREIGN PATENT DOCUMENTS

CN          204407983 U *   6/2015  ............... H02H 7/18
DE   10 2009 024 422 A1     1/2011
(Continued)

*Primary Examiner* — Catherine T. Rastovski
*Assistant Examiner* — Lal C Mang
(74) *Attorney, Agent, or Firm* — Maginot, Moore & Beck LLP (57) ABSTRACT

A method for operating a system including a battery-operated machine having a battery, the method includes continuously providing operating variables of the battery, ascertaining operating features for a current evaluation period depending on characteristics of the provided operating variables, the operating features characterizing a use of the battery in the current evaluation period, ascertaining at least one stress-maximizing operating feature of the ascertained operating features that is associated with a stress factor for the battery using a state of health model, the stress factor having a greatest influence on aging of the battery, and signaling a measure in the battery-operated machine depending on the stress factor.

12 Claims, 4 Drawing Sheets

(51) Int. Cl.
  *G06N 20/00*   (2019.01)
  *G01R 31/367*  (2019.01)
  *G06N 3/047*   (2023.01)

(56) References Cited

U.S. PATENT DOCUMENTS

2017/0120766 A1* 5/2017 Huber ................. B60L 11/1861
2018/0145527 A1* 5/2018 Ravi ..................... H02J 7/0057
2019/0129421 A1* 5/2019 Ewert .................... H04L 67/10

FOREIGN PATENT DOCUMENTS

| DE | 10 2011 005 711 A1 | 9/2012 |
| DE | 10 2014 212 451 A1 | 12/2015 |
| DE | 10 2015 001 050 A1 | 8/2016 |
| DE | 10 2016 211 898 A1 | 1/2018 |
| DE | 10 2018 220 494 A1 | 5/2020 |
| EP | 2 631 663 A1 | 8/2013 |
| WO | 2020/187409 A1 | 9/2020 |

\* cited by examiner

METHOD AND APPARATUS FOR MACHINE-INDIVIDUAL IMPROVEMENT OF THE LIFETIME OF A BATTERY IN A BATTERY-OPERATED MACHINE

This application claims priority under 35 U.S.C. § 119 to patent application no. DE 10 2020 212 278.4, filed on Sep. 29, 2020 in Germany, the disclosure of which is incorporated herein by reference in its entirety.

FIELD

The disclosure relates to battery-operated machines, in particular electric vehicles or hybrid vehicles, and furthermore to management methods and systems with functions for extending a lifetime of a battery.

BACKGROUND

Battery-operated machines are supplied with energy using an electrical energy store, generally using a battery. The state of health of the battery changes appreciably over the course of its lifetime, the effect of which is a declining storage capacity. A degree of the aging depends on stress factors, which result from the type of use of the battery. The individual load of the battery is dependent on the machine type and/or on the usage behavior of a user and accordingly has a machine-individual influence on the characteristic of the state of health.

A variable that is of interest for the user is the remaining lifetime of the battery, which can be determined from the current state of health. This information enables the user to plan an exchange of the battery in the longer term.

Furthermore, although a lifetime guarantee for batteries is specified by manufacturers, it is possible that this will not be fulfilled due to accordingly stressing use of the battery.

It is therefore desired to influence the use of the battery in order to increase the lifetime thereof when particular stress factors can be identified or when possibly non-fulfilment of the lifetime guarantee is foreseeable.

SUMMARY

The disclosure provides a method for operating a system having a battery-operated machine having a battery and for providing a measure for machine-individual extension of the lifetime of the battery of a machine and also an apparatus and a system having a central processing unit and a plurality of machines.

According to a first aspect, provision is made of a computer-implemented method for operating a system having a battery-operated machine having a battery, having the following steps:
  continuously providing operating variables of the battery;
  ascertaining operating features or useful patterns for a current evaluation period depending on the characteristics of the provided operating variables, wherein the operating features characterize a use of the battery in the evaluation period;
  ascertaining one or multiple stress-maximizing operating features or useful patterns that are associated with a stress factor for the battery, said stress factor having the greatest influence on the aging of the battery, using a state of health model;
  signaling a measure in the machine depending on the ascertained stress factor.

The state of health of a battery is usually not measured directly. This would require a series of sensors in the battery, which would make the production of such a battery complex and increase the space requirement. Methods suitable for the automotive sector for determining the state of health in the machine are additionally not yet available for real-life operation. The current state of health is therefore generally ascertained using a physical or empirical aging model in the machine. This physical state of health model exhibits worst case model errors of more than 5%. The inaccuracy of the physical state of health model also means that it can only indicate the present state of health of the battery. A prediction of the state of health, which is in particular dependent on the manner of operation of the battery, such as for example on the level and amount of charge flowing in and out, and hence on an operating behavior and on machine parameters, would lead to very inaccurate predictions and is therefore not usable in the machine at this time.

State of health (SOH) is the key variable for indicating a remaining battery capacity or remaining battery charge. The state of health can be indicated as a capacity retention rate (SOH-C) or as a rise in the internal resistance (SOH-R). The capacity retention rate SOH-C is indicated as a ratio of the measured present capacity to an initial capacity of the fully charged battery. The relative change in internal resistance SOH-R rises as the battery ages.

The above method uses a user-individual and machine-individual prediction of a state of health of the electrical energy store based on a data-based or hybrid (physical and data-based) state of health model in a central processing unit. This state of health model can be produced using evaluated fleet data.

The above method makes provision for stress factors that have the greatest influence on the aging of the battery to be ascertained depending on a user-individual operation of the machine. As a result, it is possible, depending on the stress factors, to ascertain measures that can be used to slow down the aging of the battery as best as possible in order thus to extend the remaining lifetime of the battery with as few restrictions as possible and thus restrictions which are more acceptable to the user.

Stress factors within the context of this description stress the battery and can significantly age it. Operating features determine useful patterns that constitute a typical machine-individual behavior, for example frequent rapid charging in the mornings. Stress factors are derived from the useful patterns, that is to say in the example: high currents at low temperatures, which leads to LI plating and thus to aging. Stress factors are thus based on known chains of action for aging.

It is possible in principle, by predicting the state of health of the battery, in particular using an appropriate data-based state of health model based on fleet data, to determine when a target value of the state of health or a remaining lifetime of zero is reached. This may be signaled to a user in order to prompt said user to exchange the battery. It is also helpful to indicate the remaining lifetime in order to identify whether a guaranteed overall lifetime of the battery is complied with in accordance with the manufacturer specifications.

In particular, one difficulty consists in prescribing a guarantee for a lifetime of a battery without user-individual stress factors being taken into account. Users can thus stress the battery more or less through different use, as a result of which the aging of the battery is impacted significantly. A prescribed guarantee, such as for example a decrease of the state of health to 80% of the capacity at the installation time within a specific period, of for example eight years, can thus be provided only conditionally.

The above method makes it possible to extend the lifetime of the battery by providing specific measures. In particular, a suitable measure for extending the lifetime of the battery can be proposed to a user. In addition, there is an option of connecting the guarantee promise for a battery to the adherence to the proposed measures.

The proposed measures are proposed taking into account the typical useful patterns of the user according to a selection of the stress factor or factors whose change can have the greatest influence on the change in the state of health. This makes it possible to intervene in the usage habits of the user in a gentle manner since the measures relate only to one or a few aspects of the useful patterns or usage habits of the user. It is therefore possible to achieve a particularly good acceptance of the proposed measures.

The typical useful patterns are derived and evaluated by means of fleet analysis. The one or the multiple stress-maximizing operating features are ascertained external to the machine in a central processing unit in which the state of health model, which is produced in particular based on fleet data of a plurality of machines, is implemented.

Furthermore, a target value for the one or the multiple stress-maximizing operating features can be ascertained as a value for the one or the multiple stress-maximizing operating features at which the aging of the battery currently still ensures the reaching of a prescribed minimum lifetime of the battery given an otherwise constant characteristic of the operating features.

In particular, the measure to be signaled can be assigned depending on the ascertained one or the multiple stress-maximizing operating features and the respective target value of the one or the multiple stress-maximizing operating features.

Provision can be made for the ascertaining of the one or the multiple stress-maximizing operating features to take into account only those operating features that are assigned to measures from an acceptance set of measures, wherein signaled measures that have not been implemented by a user once or several times are removed from the acceptance set of measures.

Furthermore, the one or the multiple stress-maximizing operating features can be ascertained by virtue of a standardized gradient of the state of health against the operating features being ascertained using the state of health model, wherein that or those operating feature or features for which the standardized gradient is highest is or are selected as stress-maximizing operating features.

Furthermore, the operating variables of the battery of a specific machine can be transmitted to a central processing unit external to the machine, wherein the steps of ascertaining operating features for a current evaluation period and ascertaining the one or the multiple stress-maximizing operating features are executed in the central processing unit, wherein the one or the multiple stress-maximizing operating features are transmitted to the specific machine.

According to a further aspect, an apparatus for operating a battery-operated machine having a battery is provided, wherein the apparatus is designed to:

continuously provide operating variables of the battery;
ascertain operating features for a current evaluation period depending on the characteristics of the provided operating variables, wherein the operating features characterize a use of the battery in the evaluation period;
ascertain one or multiple stress-maximizing operating features that are associated with a stress factor for the battery, said stress factor having the greatest influence on the aging of the battery, using a state of health model;
signal a measure in the machine depending on the ascertained stress factor.

According to a further aspect, a system having a central processing unit and a plurality of machines is provided, wherein each machine comprises the above apparatus.

Provision can be made for the central processing unit to be designed to ascertain operating features and to ascertain the one or the multiple stress-maximizing operating features.

BRIEF DESCRIPTION OF THE DRAWINGS

Embodiments are explained in more detail below with reference to the appended drawings, in which.

DETAILED DESCRIPTION

The method according to the disclosure is described below on the basis of vehicle batteries as batteries in a plurality of motor vehicles as battery-operated machines. A data-based state of health model for the respective vehicle battery may be implemented in a control unit in the motor vehicles. The state of health model may be continually updated or retrained in a central processing unit based on operating variables of the vehicle batteries from the vehicle fleet.

The example above is representative of a multiplicity of stationary or mobile battery-operated machines and equipment with a mains-independent energy supply, such as for example vehicles (electric vehicles, pedelecs, etc.), installations, machine tools, domestic appliances, TOT equipment, a building energy supply, aircraft, in particular drones, autonomous robots and electronic entertainment equipment, in particular cell phones, and the like, that are connected to a central processing unit (cloud) by way of an appropriate communication connection (e.g. LAN, Internet).

Figure 1:
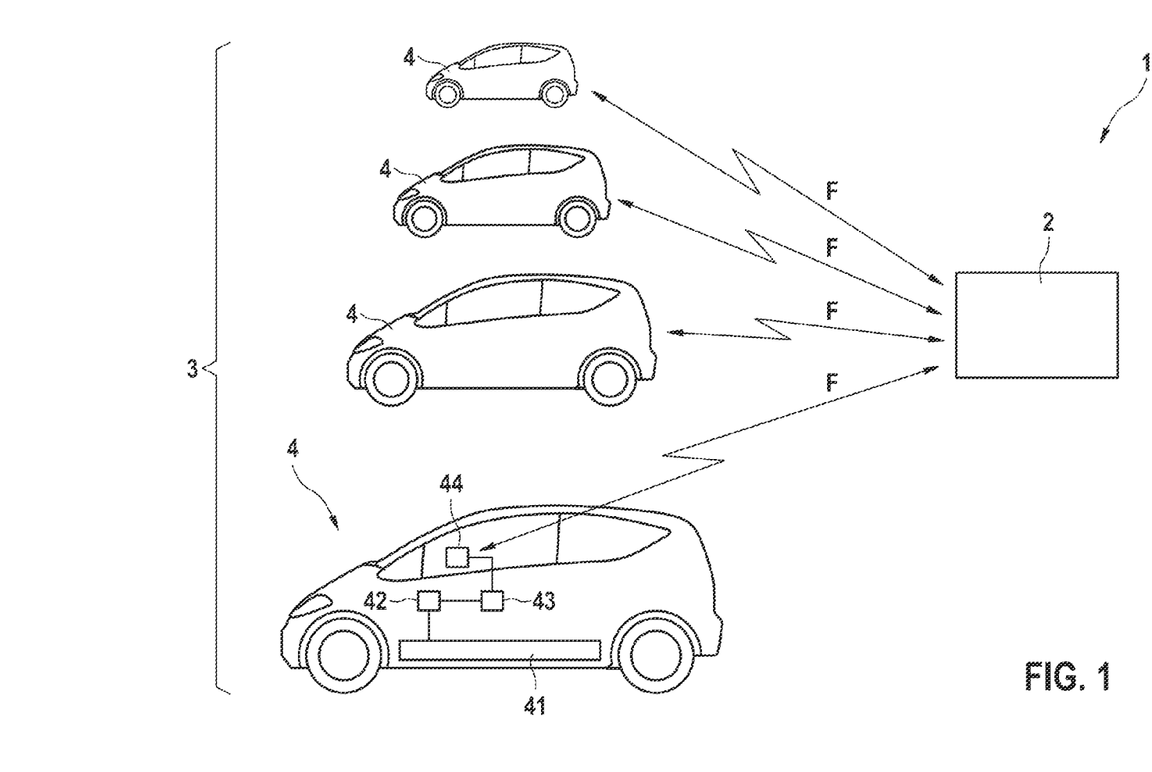
FIG. 1 shows a schematic illustration of a system for providing driver-individual and vehicle-individual load variables for a vehicle battery based on fleet data.

FIG. 1 shows a system 1 for collecting fleet data in a central processing unit 2 for the purpose of producing a state of health model. The state of health model is used to determine a state of health of an electrical energy store in a motor vehicle. FIG. 1 shows a vehicle fleet 3 with multiple motor vehicles 4.

One of the motor vehicles 4 is illustrated in more detail in FIG. 1. The motor vehicles 4 each have a vehicle battery 41 as a rechargeable electrical energy store, an electric drive motor 42 and a control unit 43. The control unit 43 is connected to a communication module 44 that is suitable for transferring data between the respective motor vehicle 4 and a central processing unit (a so-called cloud).

The motor vehicles 4 transmit the operating variables F, which at least indicate variables that influence the state of health of the vehicle battery, to the central processing unit 2. In the case of a vehicle battery, the operating variables F can indicate a present battery current, a present battery voltage, a present battery temperature and a present state of charge (SOC), and also at pack, module and/or cell level alike. The operating variables F are captured in a fast time frame of between 2 Hz and 100 Hz and can be transferred to the central processing unit 2 in uncompressed and/or compressed form on a regular basis. By way of example, the time series can be transferred to the central processing unit 2 in blocks at intervals of between 10 min and several hours.

Operating features that relate to an evaluation period can be generated from the operating variables F in the central processing unit 2, or in other embodiments also in the respective motor vehicles 4 already. The evaluation period for determining the state of health can be between a few hours (for example 6 hours) and several weeks (for example one month). A customary value for the evaluation period is one week.

The operating features can for example comprise features referenced to the evaluation period and/or accumulated features and/or statistical variables ascertained over the entire life hitherto. In particular, the operating features can for example comprise: electrochemical states (layer thicknesses, concentrations, cyclizable lithium, . . . ), histogram data for the state of charge characteristic, the temperature, the battery voltage, the battery current, in particular histogram data regarding the battery temperature distribution over the state of charge, the charging current distribution over the temperature and/or the discharge current distribution over the temperature, accumulated total charge (Ah), an average capacity increase during a charging process (in particular for charging processes in which the charge increase is above a threshold proportion (e.g. 20%) of the total battery capacity), a maximum for the differential capacity (dQ/dU: change of charge divided by change of battery voltage), and more.

The individual operating feature that characterizes an operating behavior of a driver reveals further details: a temporal load pattern such as charging and driving cycles, determined by usage patterns (such as for example fast charging at high current levels or sharp acceleration or regenerative braking processes), a usage period for the vehicle battery, a charge accumulated over the operating time and a discharge accumulated over the operating time, a maximum charging current, a maximum discharge current, a frequency of charging, an average charging current, an average discharge current, a power throughput during charging and discharge, an (in particular average) charging temperature, an (in particular average) spread of the state of charge, and the like.

The operating variables are specified so that they can be updated at future times by known data-based extrapolation methods (such as autoregressive models, for example ARMA or ARIMA models), which model trends and periodicities in loads and as a result can be used to predict a predicted state of health.

In addition, as part of the operating variables, environmental variables can be sent to the central processing unit 2 or detected or ascertained there, wherein the environmental variables give information about the surroundings and/or a traffic and/or weather situation of the environment of the motor vehicle 4. The environmental variables may comprise one or more of the following variables: traffic data, information about the volume of traffic on a predicted route, weather data and the location of the motor vehicle.

A state of health model, which is in particular data-based or is designed as a hybrid state of health model having a physical model and a data-based correction model, can be implemented in the central processing unit 2. The state of health model can be used on a regular basis, that is to say after the respective evaluation period has elapsed, to ascertain the present state of health of the vehicle battery 41 based on the operating variables and/or the operating features. In other words, it is possible to ascertain a state of health of the relevant vehicle battery 41 based on the operating features obtained from the operating variable characteristics of one of the motor vehicles 4 of the fleet 3.

Additionally, it is possible to ascertain operating features, for example by linear or non-linear extrapolation or using a prediction model, future states of health of the vehicle battery 41. The operating variables, that is to say characteristics of the battery current, the battery voltage, the state of charge and the battery temperature can also be used as input variables for the prediction model and extrapolated accordingly.

Furthermore, stress factors for the evaluation period can be identified from the operating features, said stress factors each bringing about a particular loading of the vehicle battery, such as for example the number of rapid charging cycles, high discharge currents due to high vehicle acceleration or high vehicle speeds, a high current load at low and high temperatures, frequent discharging up to the end-of-discharge voltage (low SoC of for example 20%) and other stress factors constituting a high load, which can cause rapid aging of the vehicle battery 41.

The state of health model in the central processing unit 2 can be trained based on detailed measurements of vehicle batteries 41 of the vehicles 4 in the fleet 3. To this end, training data for the state of health model are take place by determining the actual state of health of a respective vehicle battery 41. For example, the capacity retention rate (SOH-C) can be determined by measuring the overall charge withdrawal of a battery during a charging cycle from a fully discharged state to a fully charged state. In the central processing unit 2, there is therefore a data-based aging model available, which is suitable for ascertaining the actual state of health of a vehicle battery 41 of a motor vehicle 4 located in the fleet 3 and for predicting states of health by updating operating features in future evaluation periods.

Figure 2:
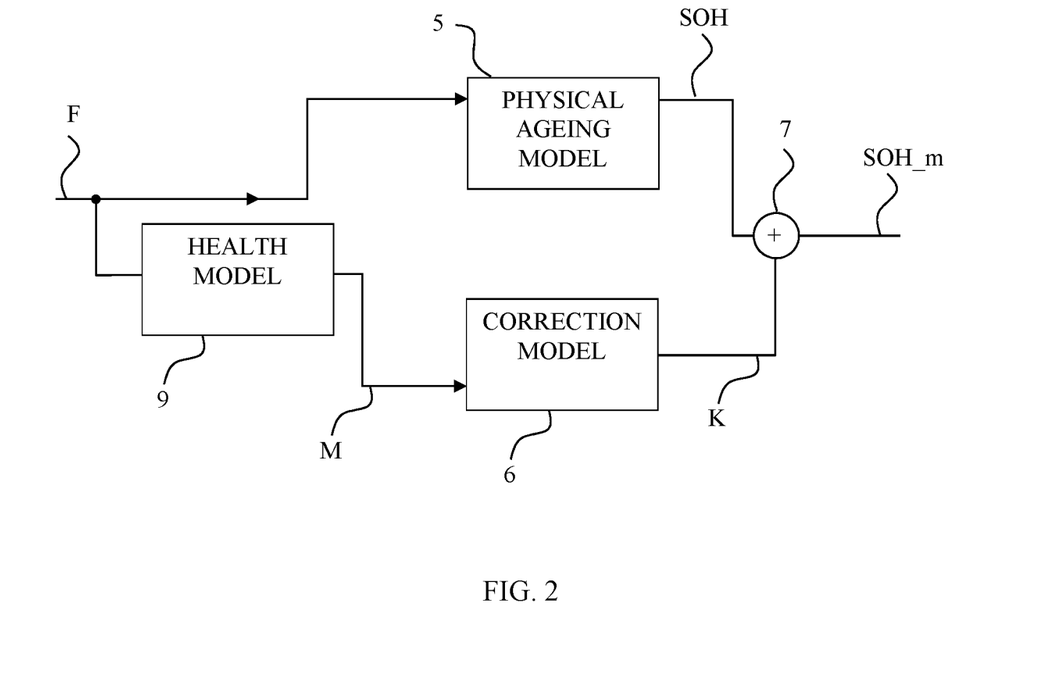
FIG. 2 shows a schematic illustration of a functional structure of a hybrid state of health model.

FIG. 2 schematically shows, by way of example, the functional structure of one embodiment of a data-based state of health model 9 that is structured in a hybrid manner. The state of health model 9 comprises a physical aging model 5 and a correction model 6. These obtain operating features M of a present evaluation period from a feature extraction block 8 based on the time series of the operating variables F. As an alternative, the operating variables F may also be incorporated directly into the physical state of health model 5, which is preferably implemented as an electrochemical model and describes corresponding electrochemical states, such as layer thicknesses of the active materials, change in the cyclizable lithium due to anode/cathode side reactions, structure of the solid electrolyte interface (SEI interface), slow consumption of electrolytes, loss of active material of the anode, loss of active material of the cathode, etc.), etc. using nonlinear differential equations.

The physical aging model 5 corresponds to an electrochemical model of the battery cell and the cell chemistry. This model ascertains internal physical battery states on the basis of the operating features M in order to provide a physically based state of health in the form of a capacity retention rate (SOH-C) and/or an internal resistance rate of rise (SOH-R).

The model values provided by the electrochemical model for the state of health SOH are however inaccurate in some situations, and provision is therefore made to correct these with a correction variable k. The correction variable k is provided by the data-based correction model 6 that is trained using training datasets from the vehicles 4 of the vehicle fleet 3.

To determine a corrected state of health SOH_m, the outputs SOH, k of the physical aging model 5 and of the correction model 6, which is preferably implemented as a Gaussian process model, are applied to one another. These may in particular be added or multiplied (not shown) in a summing block 7 in order to obtain the corrected state of health SOH_m at a present evaluation period.

Other configurations of the data-based state of health model are likewise possible; for example, the data-based state of health model may be in the form of a non-hybrid, purely data-based model based on a probabilistic or on an artificial intelligence-based regression model, in particular a Gaussian process model, or a Bayesian neural network. This is trained to provide a state of health SOH from an operating feature point that is defined by present operating features M of a present evaluation period, wherein the operating features are ascertained in a feature extraction block 8 based on the time series of the operating variables F.

Figure 3:
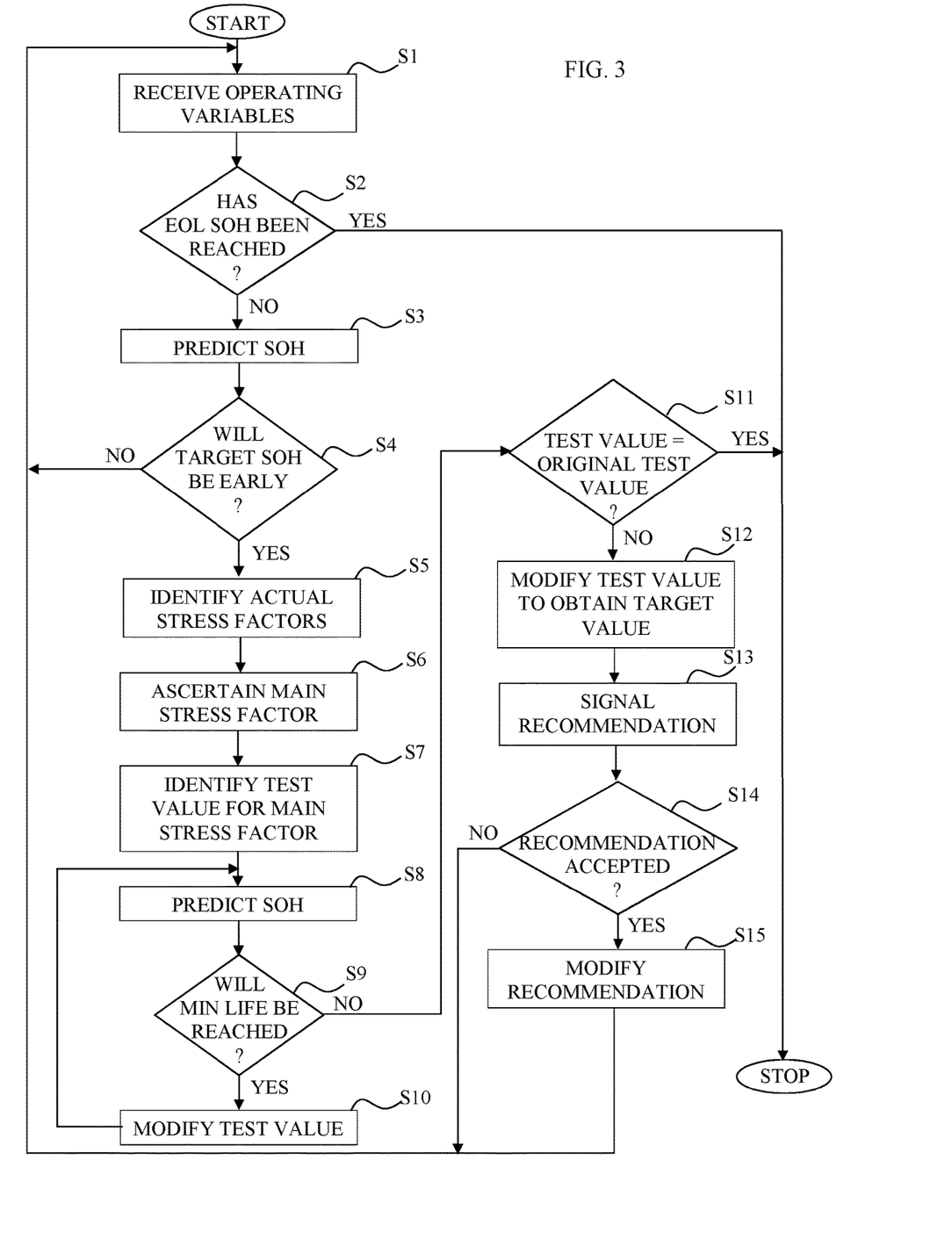
FIG. 3 shows a flowchart to illustrate a method for signaling a measure for the operation of a motor vehicle.

FIG. 3 shows a flowchart for illustrating a method for ascertaining a measure for extending the lifetime of the vehicle battery, in particular measures that help an already stressed vehicle battery 41 to reach a prescribed target lifetime.

The method can be executed in the central processing unit 2 for each of the motor vehicles 4 of the fleet 3. As an alternative, the method can also be carried out in the motor vehicles 4 when the state of health model is implemented in the motor vehicles 4. For this purpose, the time series of the operating variables for each evaluation period and corresponding characteristics of the states of health of the vehicle batteries 41 of the motor vehicles 4 are available to the central processing unit 2. As an alternative, the method described below can also be carried out in the motor vehicles 4 when a corresponding state of health model is provided in the motor vehicle.

In step S1, the operating variables F are received by a specific vehicle 4 for a current evaluation period. Operating features can be extracted from the time series of the operating variables F stored in the central processing unit 2. Using the state of health model, the current state of health of the vehicle battery 41 can thus be ascertained based on the operating features and the last ascertained state of health.

In step S2, a check is carried out to determine whether a target state of health, which corresponds to an end of the lifetime of the vehicle battery 41, has been reached. The target state of health may be for example 80% SOH-C. This indication corresponds to a capacity of the vehicle battery 41 of 80% of the battery capacity available at the beginning of life. If it is identified in the current time step that the current state of health indicates a higher remaining capacity of the vehicle battery 41 (alternative: No), the method continues with step S3. If it is determined in step S2 that the target state of health has been reached or undershot (alternative: Yes), then the method is ended.

In step S3, the characteristic of the state of health is predicted for future evaluation periods. This can be carried out using the data-based state of health model, for example by extrapolating the operating variables and/or the operating features or otherwise predicting the development of the operating features, and successively calculating the state of health for subsequent future evaluation periods in each case based on a state of health reached at a preceding time step. Furthermore, environmental variables for future evaluation periods can also be taken into account depending on the time of year, in particular with respect to the predictions regarding the battery temperature.

Other methods for predicting the characteristic of the state of health based on the temporal characteristics of the operating variables, such as for example by comparing the previous characteristic of the state of health of a vehicle battery with aging characteristics of other vehicles 4 of the fleet 3 recorded in the central processing unit 2 and whose vehicle batteries 41 have already reached the end of their lifetime are likewise conceivable.

The prediction can be carried out for example until criteria that indicate an end of the lifetime of the vehicle battery 41 have been reached. For example, after each calculation of a state of health for a subsequent evaluation period, it is possible to check using a criterion whether a battery capacity greater than 80% of the initial battery capacity is present.

In step S4, a check is carried out based on the predicted characteristic of the state of health to determine whether the prescribed target state of health is reached before a prescribed minimum lifetime of the vehicle battery 41 elapses. The minimum lifetime in conjunction with the target state of health indicates a period in which the vehicle battery 41 can be used expediently. For example, a common specification corresponds to reaching a target state of health of 80% of the initial capacity after eight years at the earliest. This check can ascertain the overall lifetime of the vehicle battery 41 from the sum of the current age of the vehicle battery 41 and the number of evaluation periods until the target state of health is reached.

If it is determined in step S4 that the minimum lifetime is not reached (alternative: Yes), then the method continues with step S5, otherwise (alternative: No), there is a jump back to step S1 and no action recommendation to the driver is necessary.

In step S5, the stress factors that cause aging of the vehicle battery 41 are identified through an analysis of the state of health model.

It is possible to evaluate using the state of health model the effects that the stress factors have on the specific battery aging. This allows an optimization problem to be formulated in order to adjust or to optimize useful patterns with respect to the stress factors thereof in that a desired aging behaviour is achieved. Such stress factors may be, for example, the number of rapid charging cycles, high flows of current at high temperatures, the number of charging and discharge cycles at very high states of charge (>80% of the maximum state of charge) or at very low states of charge (<20% of the maximum state of charge) and the like. These stress factors can be obtained by taking into consideration one or more of the operating features that are derived from the operating variables.

Stress factors are known from laboratory measurements before commissioning. However, noticeable problems with respect to aging phenomena emerging from fleet data can also be identified as corresponding stress factors based on the operating features. Stress factors are obtained directly from the state of health model, that is to say, for example, the operating features for the correction model (Gaussian process) in the hybrid state of health model.

The stress factors are generally distinguished by one of the operating features. In other words, stress factors are operating features that can significantly age the battery.

In step S6, the most influential of the stress factors is ascertained. This can be done by solving an optimization problem using the aging model, that is to say, for example, by deriving the characteristic of the state of health according to each of the operating features that determine the stress factors. The greater the quotient of the change in the state of health over time and the change in the operating feature that determines a stress factor over time, the greater the influence of the stress factor assigned to the respective operating variable. When the stress factors are selected, provision can be made for only those stress factors that are present in an acceptance set of stress factors to be taken into account. As described in more detail further below, stress factors can be excluded from the acceptance set for selecting the most influential stress factor when the measures assigned thereto have been taken into account by the behavior of the driver once, several times or only partly.

The influence of a stress factor on the aging of the vehicle battery 41 can be evaluated using the state of health model. As an alternative, in the case of known stress factors from laboratory measurements, the strength of the influence on the aging behavior can be determined/ascertained. This can be done by means of weighting factors or classifications (strong/average/weak).

For example, a stress factor can exist in frequent rapid charging. The influence of this stress factor on the aging of the vehicle battery 41 can be determined in a model-based manner, for example using a hybrid aging model. As an alternative, the influence of this stress factor on the aging of the vehicle battery 41 can be determined by a quotient of the change in the state of health within an evaluation period and a frequency of the rapid charging within the evaluation period.

In step S7, for the determined most influential stress factor, a test value of a stress-maximizing operating feature assigned to the relevant stress factor can be assigned, said test value preferably corresponding to the best possible value of the relevant stress-maximizing operating feature. The best possible value of the relevant stress-maximizing operating feature corresponds to a value that is most gentle with respect to the operating feature for the aging of the vehicle battery.

In step S8, in a manner corresponding to the procedure in steps S1 and S2, the characteristic of the state of health is now predicted under the assumption that, while retaining and updating the other operating features for future evaluation periods, the stress-maximizing operating feature assumes the test value and ascertains the duration of time for which the target state of health is reached or undershot.

The remaining lifetime or overall lifetime resulting therefrom is checked in step S9 to determine whether the minimum lifetime of the vehicle battery 41 is reached. If it is determined in step S9 that the minimum lifetime is no longer reached (alternative: No), then the method continues with step S11, otherwise (alternative: Yes), in step S10 the test value is changed incrementally by optimizing the useful patterns and thus implicitly the stress factors using the aging model in a direction by way of which the vehicle battery 41 is subjected to a higher aging load, and the method continues with step S8. The increments are whole numbers in the case of frequencies and selected to be sufficiently small in terms of their absolute value in the case of electrical variables so that a determination of the extent of the stress-maximizing operating feature that is as accurate as possible for a recommendation of a measure is possible.

In step S11, a check is carried out to determine whether the test value corresponds to the initially assumed test value. If this is the case (alternative: Yes), it is determined that the minimum lifetime of the vehicle battery 41 can no longer be reached, and the method ends. Otherwise (alternative: No), the method continues with step S12.

In step S12, the test value corresponds to a value at which the minimum lifetime of the vehicle battery 41 currently no longer reaches through appropriate selection of the relevant stress-maximizing operating feature. Therefore, the value of the stress-maximizing operating feature is accordingly changed incrementally (according to the absolute value of the increment selected above) in the direction of a lower load of the vehicle battery 41 in order to obtain a target value of the operating feature.

In step S13, a measure is now assigned to the relevant stress-maximizing operating feature and the target value thereof using an assignment model and this measure is signaled to a driver of the motor vehicle.

Figure 4:
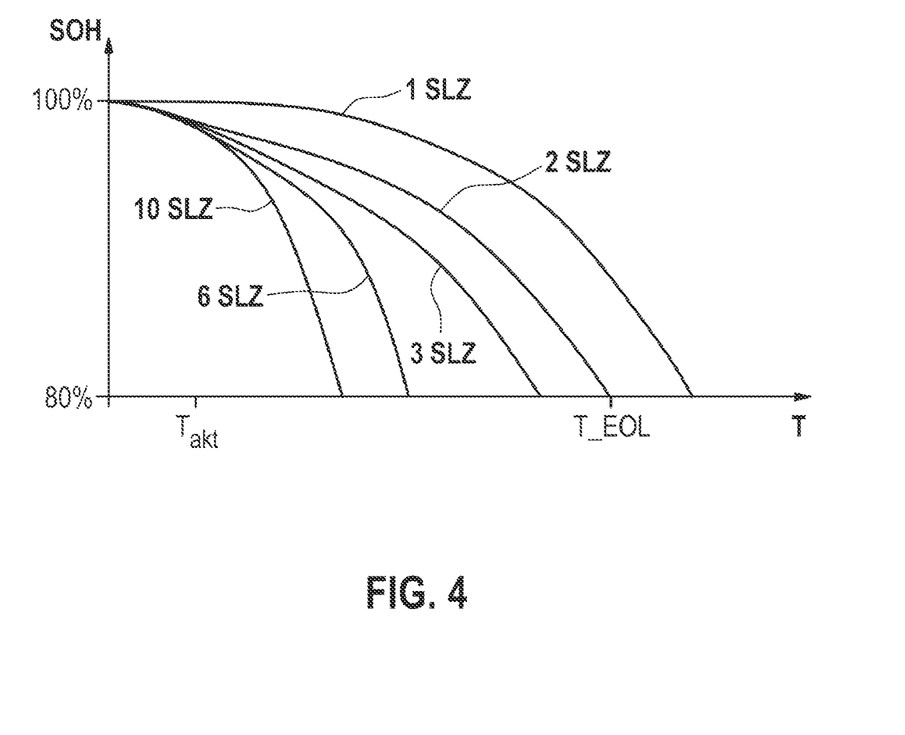
FIG. 4 shows an illustration for the characteristics of the state of health at different frequencies of rapid charging cycles to determine the measures for extending the lifetime of the vehicle battery with simultaneous optimization of the driver acceptance.

In this way, it is possible to always propose to a driver the most influential measure in order to extend the lifetime of the vehicle battery 41. As a result, it is possible, for example, that a reduction in the rapid charging processes is proposed as a measure to a driver who frequently charges his vehicle battery 41 at a rapid charging station at a high battery temperature and not a power reduction by way of current limitation since the driver is primarily traveling in city traffic. For example, FIG. 4 illustrates the characteristic of the state of health SOH of the vehicle battery 41 as a stress factor of the rapid charging frequency SLZ by way of example for various frequencies. In this case, the procedure for ascertaining the number of necessary rapid charging cycles SLZ is illustrated proceeding from an achieved SOH value at a current time $T_{akt}$ by the rising test value for the rapid charging frequency in order to reach the prescribed minimum lifetime. In this case, a reduction from ten rapid charging cycles to two rapid charging cycles per month would be an action recommendation to the driver, because the minimum lifetime can be reached as a result thereof.

In the reverse case, in which a driver predominantly drives on highways at high speeds and high battery temperatures and as a result the vehicle battery 41 is aging more quickly, a power reduction can be recommended to the driver, because this constitutes the greatest influencing factor on the battery aging and not the reduction of the rapid charging cycles seldom performed by him.

While the stress factor can relate to an operating feature or a variable derived therefrom, such as for example an operating feature gradient or an operating variable integral, the measures can either have a direct effect on the change in the operating feature and thus reduce the aging of the vehicle battery on account of the corresponding stress factor. The frequency of rapid charging processes can thus, for example, be assigned to a reduction in the number of rapid charging cycles directly by the proposed measure. However, if the stress factor determined is that the vehicle battery is regularly charged at very high temperatures, it is thus possible to propose a change in the charging time to periods during the night as recommended measure.

Instead of signaling a measure to the driver, the measures can where required be implemented in the vehicle automatically, for example by limiting the current consumption during a charging process or limiting the maximum discharge current.

In step S14, it is possible to ascertain for recent evaluation periods and recent measures whether the driver has not or has only partly taken into account the respective measures proposed in step S13. This can be done by comparing the operating feature assigned to the proposed measure and the target value of the operating feature ascertained for this. If it is determined in subsequent evaluation periods once or several times that the signaling of the measure for adjustment of the operating feature in the direction of the corresponding target value has not led to the target value being reached (alternative: Yes), in step S15 the acceptance set can be reduced by the stress factor assigned to the operating feature so that the corresponding measure is no longer proposed to the driver. Otherwise, the method continues with step S1.

The above procedure in particular achieves a situation in which a driver who only partly takes into account the proposed measure, that is to say, as in the above example, does not reduce the rapid charging cycles to two rapid charging cycles SLZ per month but instead reduces them to four, is given a further measure in order that the target of reaching the minimum lifetime can be achieved. A combination of several measures can thus also lead to the target, wherein the driver acceptance of the various measures is taken into account.

In particular, only after it has been determined several times that the signaling of the measure for adjusting the operating feature in the direction of the corresponding target value has not led to the target value being reached can the acceptance set be reduced by the stress factor assigned to the operating feature. If the driver only partly observes a recommendation, for example "reduce rapid charging cycles", a further identical recommendation to the driver for the next period to reduce the number of rapid charging cycles even further can possibly actually motivate the driver to act in a more battery-conscious manner. A further recommendation to the driver for the next period to reduce the number of rapid charging cycles even further will, in contrast, highly likely not be accepted by the driver if he has completely ignored the recommendation before. It is thus possible to provide as the next measure a proposal based on the next most influential or the second most influential stress factor, so that the driver can implement the corresponding measures that have the greatest influence on the extension of the lifetime of the vehicle battery within his acceptance range.

What is claimed is:

1. A method for operating a system including a battery-operated machine having a battery, the method comprising:
   continuously providing operating variables of the battery;
   ascertaining operating features for a current evaluation period depending on characteristics of the provided operating variables, the operating features characterizing a use of the battery in the current evaluation period;
   ascertaining at least one stress-maximizing operating feature of the ascertained operating features that is assigned to user controllable measures from an acceptance set of user controllable measures, and that is associated with a first stress factor for the battery using a state of health model, the first stress factor having a greatest influence on aging of the battery;
   signaling to a user of the battery-operated machine a first user controllable measure, related to the associated first stress factor, and associated with a prescribed minimum battery lifetime;
   determining that the first user controllable measure has not been implemented by the user;
   removing, based upon the determination, the first user controllable measure that was not implemented by the user from the acceptance set of user controllable measures; and
   signaling to the user a second user controllable measure, from the acceptance set of user controllable measures with the first user controllable measure removed, related to an ascertained second stress factor different from the first stress factor, and associated with the prescribed minimum battery lifetime.

2. The method according to claim 1, wherein:
   the operating features and/or the at least one stress-maximizing operating feature are ascertained external to the battery-operated machine in a central processing unit in which the state of health model is implemented, and
   the state of health model is produced based on fleet data of a plurality of the machines including the battery-operated machine.

3. The method according to claim 1, wherein a target value for the at least one stress-maximizing operating feature is ascertained as a value for the at least one stress-maximizing operating feature at which the aging of the battery currently still ensures reaching of the prescribed minimum lifetime of the battery given an otherwise constant characteristic of the operating features.

4. The method according to claim 3, wherein the first user controllable measure that is to be signaled is assigned depending on the at least one stress-maximizing operating feature and the target value.

5. The method according to claim 1, wherein:
   the at least one stress-maximizing operating feature is ascertained by virtue of a standardized gradient of a state of health against the operating features being ascertained using the state of health model, and
   the at least one operating feature for which the standardized gradient is highest is or are selected as the at least one stress-maximizing operating feature.

6. The method according to claim 1, wherein:
   the operating variables of the battery are transmitted to a central processing unit external to the battery-operated machine,
   ascertaining the operating features for the current evaluation period and ascertaining the at least one stress-maximizing operating feature are executed in the central processing unit, and
   the at least one stress-maximizing operating feature is transmitted to the battery-operated machine.

7. The method according to claim 1, wherein the battery-operated machine corresponds to a motor vehicle, a pedelec, an aircraft, a drone, a machine tool, a consumer electronics device, a cell phone, an autonomous robot, and/or a domestic appliance.

8. The method according to claim 1, wherein a computer program product includes instructions that, when the computer program product is executed by at least one data processing device, cause the at least one data processing device to perform the method.

9. The method according to claim 8, wherein the computer program product is stored on a non-transitory machine-readable storage medium.

10. An apparatus for operating a battery-operated machine including a battery, the apparatus comprising:
    at least one data processing device configured to:
    continuously provide operating variables of the battery;
    ascertain operating features for a current evaluation period depending on characteristics of the provided operating variables, the operating features characterizing a use of the battery in the current evaluation period;

ascertain at least one stress-maximizing operating feature of the ascertained operating features that is assigned to user controllable measures from an acceptance set of user controllable measures, and that is associated with a first stress factor for the battery using a state of health model, the stress factor having a greatest influence on aging of the battery;

signal to a user of the battery-operated machine a first user controllable measure, related to the associated first stress factor, and associated with a prescribed minimum battery lifetime;

determine that the first user controllable measure has not been implemented by the user;

remove, based upon the determination, the first user controllable measure that was not implemented by the user from the acceptance set of user controllable measures; and signal to the user a second user controllable measure, from the acceptance set of user controllable measures with the first user controllable measure removed, related to an ascertained second stress factor different from the first stress factor, and associated with the prescribed minimum battery lifetime.

11. A system comprising:

a central processing unit; and a plurality of battery-operated machines operably connected to the central processing unit, each of the battery-operated machines having a battery and an apparatus for operating the battery-operated machine, the apparatus including at least one data processing device configured to:

continuously provide operating variables of the battery;

ascertain operating features for a current evaluation period depending on characteristics of the provided operating variables, the operating features characterizing a use of the battery in the current evaluation period;

ascertain at least one stress-maximizing operating feature of the ascertained operating features that is assigned to user controllable measures from an acceptance set of user controllable measures, and that is associated with a first stress factor for the battery using a state of health model, the stress factor having a greatest influence on aging of the battery;

signal to a user of the battery-operated machine a first user controllable measure, related to the associated first stress factor, and associated with a prescribed minimum battery lifetime;

determine that the first user controllable measure has not been implemented by the user;

remove, based upon the determination, the first user controllable measure that was not implemented by the user from the acceptance set of user controllable measures; and signal to the user a second user controllable measure, from the acceptance set of user controllable measures with the first user controllable measure removed, related to an ascertained second stress factor different from the first stress factor, and associated with the prescribed minimum battery lifetime.

12. The system according to claim 11, wherein the central processing unit is configured to ascertain the operating features and to ascertain the at least one stress-maximizing operating feature.

* * * * *